United States Patent
Yoon et al.

(10) Patent No.: US 6,449,873 B1
(45) Date of Patent: Sep. 17, 2002

(54) APPARATUS AND METHOD FOR DRY CLEANING OF SUBSTRATES USING CLUSTERS

(75) Inventors: Deok-Joo Yoon, Kyongki-do (KR); Myeon-Chang Sung, Seoul (KR); Kwang-Ho Jeong, Seoul (KR)

(73) Assignee: Dasan C & I Co., Ltd., Seoul (KR)

( * ) Notice: Subject to any disclaimer, the term of this patent is extended or adjusted under 35 U.S.C. 154(b) by 116 days.

(21) Appl. No.: 09/668,305

(22) Filed: Sep. 25, 2000

(30) Foreign Application Priority Data

Nov. 17, 1999 (KR) .............................. 99-51172

(51) Int. Cl.[7] .................................. F26B 3/00
(52) U.S. Cl. ..................... 34/448; 34/467; 34/487; 34/510; 34/516; 34/218; 34/232; 134/7; 134/37; 134/198; 134/902; 451/38; 451/39
(58) Field of Search ................. 34/181, 448, 467, 34/487, 510, 516, 493, 218, 230, 232; 134/37, 198, 902, 2, 6, 7; 451/36, 38, 39

(56) References Cited

U.S. PATENT DOCUMENTS

| | | |
|---|---|---|
| 5,062,898 A | 11/1991 | McDermott et al. |
| 5,294,261 A | 3/1994 | McDermott et al. |
| 5,459,326 A | 10/1995 | Yamada |
| 5,512,106 A | 4/1996 | Tamai et al. |
| 5,810,942 A | 9/1998 | Narayanswami et al. |
| 5,814,194 A | 9/1998 | Deguchi et al. |
| 5,853,962 A | 12/1998 | Bowers |
| 5,931,721 A | 8/1999 | Rose et al. |
| 6,036,581 A | * 3/2000 | Hidemitsu ................... 451/39 |

OTHER PUBLICATIONS

"Ultraviolet–ozone jet clearning process of organic surface contamination layers" by D. W. Moon, et al., Oct. 1998, 1999 American Vacuum Society, pp. 150–154.

"Yield Management" by Laura Peters, Semiconductor International 1998, http://www.semiconductor.net/semiconductor/issues/issues/1998/aug98/docs/yield.asp.

\* cited by examiner

Primary Examiner—Ira S. Lazarus
Assistant Examiner—Kathryn S. O'Malley
(74) Attorney, Agent, or Firm—Robert E. Bushnell, Esq.

(57) ABSTRACT

Disclosed is a dry cleaning apparatus and method using cluster for cleaning a surface of a specimen such as semiconductor wafer. The cleaning method first forms a neutral cluster no having polarity by passing a cleaning gas such as argon, nitrogen, or carbon dioxide gas through a sand glass-shaped nozzle. The formed neutral cluster is injected at an acute angle with respect to a surface of the specimen, thereby removing particles or organic remnants attached on the surface of the specimen without damaging the surface of the specimen.

33 Claims, 5 Drawing Sheets

APPARATUS AND METHOD FOR DRY CLEANING OF SUBSTRATES USING CLUSTERS

CLAIM OF PRIORITY

This application makes reference to, incorporates the same herein, and claims all benefits accruing under 35 U.S.C. §119 from an application for DRY CLEANING APPARATUS AND METHOD USING CLUSTER earlier filed in the Korean Industrial Property Office on Nov. 17, 1999 and there duly assigned Ser. No. 51172/1999.

BACKGROUND OF THE INVENTION

1. Field of the Invention

The present invention relates to the field of cleaning of substrate surfaces, and more particularly to an apparatus and method for dry cleaning substrate surfaces using clusters formed from a process gas.

2. Description of the Related Art

Generally, as devices have become more highly integrated, the line width of semiconductor chips such as memory devices and central processing units has been also decreased. This high integration allows small sized particles which have not caused particular problems in the past to substantially affect the generation of failures in integrated circuits (ICs), and the size of particles which must be removed has become smaller and smaller. For instance, in 64 Megabit dynamic random access memory (DRAM), it is currently known that particles having diameter over 0.16 $\mu$m may cause failures in ICs. Further increases in integration will require that particles having the size of approximately 0.10 $\mu$m be removed. Also, it is well known that it is difficult to remove particles which are placed at a connection structure between wires having small line width or within contacts.

There is a spin scrubber method to remove the particles after forming an oxide or silicon film. The method sprays de-ionized water on a surface of a specimen while rotating the specimen. In order to increase the removing efficiency during the application of the above described skin scrubber method, a brushing process is additively performed, which brushes a surface of the specimen with a brushing unit being separated from the surface of the specimen.

The method has an advantage of effectively removing the particles without damaging the surface of the specimen but it is difficult to maintain an appropriate gap between the brush unit and the specimen. The method has also a drawback in that the structure of the specimen may be deformed or that a number of particles increases when the specimen has a fragile structure and is hydrophobic.

In order to resolve the drawback of the de-ionized water cleaning method which sprays de-ionized water on a rotating specimen wafer and is widely used in the cleaning process of semiconductor wafers, a cleaning method using an aerosol has been provided. This aerosol-using wafer cleaning method involves cooling a mixed gas of argon and nitrogen to near the liquification point of the mixed gas and spraying the cooled mixed gas through a nozzle into a low pressured chamber such that a part of the mixed gas forms solid particles. The solid particles as an aerosol in liquid and gas states collide with the specimen wafer, thereby removing the particles.

McDermott et al in U.S. Pat. No. 5,062,898, entitled SURFACE CLEANING USING A CRYOGENIC AEROSOL, discloses forming an aerosol containing argon solid particles by expanding a pressurized gaseous argon-containing stream, and removing particles or film on a surface of a specimen using the formed aerosol. Also, it is disclosed in the patent that a mixed gas containing argon gas is cooled to near the liquefaction point at a fixed pressure range of 20 psi to 680 psi prior to the expanding.

McDermott et al., in U.S. Pat. No. 5,294,261, entitled SURFACE CLEANING USING ARGON OR NITROGEN further describe the use of argon with nitrogen-containing solid particles as well as an aerosol containing argon-containing solid particles as cleaning source.

Tamai et al., in U.S. Pat. No. 5,512,106, entitled SURFACE CLEANING USING ARGON OR NITROGEN AEROSOL, introduced a concept and a nozzle implement as means for expanding gas. In the patent, Tamai et al. disclose previously cooling a mixture gas containing argon gas prior to supplying the mixture gas to the nozzle, and that the mixture gas supplied to the nozzle through the pre-cooling contains liquid drops of argon. The mixture gas containing previously cooled argon liquid drops is injected into an low pressured environment through the nozzle to thereby form a fluid containing argon solid drops which are created through adiabatic expansion and the fluid is then sprayed to a surface of a specimen for the cleaning.

Rose at al. disclose AEROSOL SURFACE PROCESSING in U.S. Pat. No. 5,931,721, in which they describe an apparatus for performing the cleaning method provided in the aforesaid U.S. Pat. No. 5,512,106.

Narayanswami et al., disclose AERODYNAMIC AEROSOL CHAMBER in U.S. Pat. No. 5,810,942, in which they claim a hydrodynamic structured chamber for spraying aerosol on a surface of aspecimen for the cleaning and allowing both of aerosol and objects such as particles as removed to be easily extracted.

Also, it was reported in *Semiconductor International,* August 1998, that ARIES, which is the trade name of a system for cleaning using a stream of cryogenic argon and nitrogen "crystals", was applied to a cleaning process during device fabrication and thereby approximately 1–8% improvement in yield was achieved. The report shows that the yield improvement is greater when the equipment is applied after forming a high pressured oxide layer, after forming nitride layer, and after etching aluminum.

Separately from the goal of removing particles, various solvents had been developed in order to remove polymer which is formed on side walls of aluminum wire after the aluminum wire is deposited and then etched during patterning, and is being used in mass production of semiconductor devices. However, it is generally known that these solvents are ineffective in removing particles.

D. W. Moon et al. report in *Journal of Vacuum Science and Technology A,* Vol. 17(1) (January/February 1999), 150–154, the irradiation of ultraviolet rays onto a contaminated silicon wafer for the cleaning in an ambient of ozone. However, this method also is not effective in removing particles.

There is disclosed in U.S. Pat. No. 5,853,962, to Bowers, entitled PHOTORESIST AND REDEPOSITION REMOVAL USING CARBON DIOXIDE JET SPRAY, a method injecting a high pressured liquified $CO_2$ through a nozzle, thereby transforming the liquified $CO_2$ into soft solid $CO_2$, and then spraying the solid $CO_2$ on a surface of a specimen, thereby removing photoresist of organic material.

However, when this method is applied to silicon wafer processes, it is difficult to form high purity of $CO_2$, thereby causing particles to be remained on the surface of the specimen during the evaporation of $CO_2$ which has been compressed on the surface of the specimen. Since the remaining particles cause re-contamination of the specimen, it is anticipated that it is difficult to apply the method to silicon wafers which require high purity within near future.

U.S. Pat. No. 5,459,326, to Yamada, entitled METHOD FOR SURFACE TREATMENT WITH EXTRA-LOW-SPEED ION BEAM, describes a method injecting into a high pressurized vacuum chamber gas which passes through a nozzle without pre-cooling the gas which has passed through the nozzle, in which the method is characterized by using only adiabatic expansion due to a pressure difference between the gas pressure and the chamber pressure, differently from methods using aerosol, forming clusters through these processes, and accelerating these clusters from an accelerating terminal using electric field.

Deguchi et al., in U.S. Pat. No. 5,814,194, discloses SUBSTRATE SURFACE TREATMENT METHOD. This method is adapted for smoothing a surface of a diamond specimen formed by a chemical vapor deposition, in which cluster particles containing a plurality of molecules or atoms are prepared by a gas cluster forming method, are accelerated, and are sprayed on the diamond specimen. Although the clusters are accelerated with a sufficiently high voltage, since the clusters containing a few thousand molecules have a large mass while are ionized into a monovalent ion, an energy of the molecules contained in the cluster is smaller than that of molecule ions and the clusters are fragile as soon as they collide with the surface of the specimen. Thus, although sufficiently accelerated clusters are injected onto the surface of the specimen, the molecules contained in the cluster damages or stays at the surface of the specimen rather than they are deeply stuck at a depth from the surface of the specimen.

SUMMARY OF THE INVENTION

It is therefore an object of the present invention to provide an improved method and apparatus for cleaning a substrate surface.

A further object of the present invention to provide a method and an apparatus capable of removing particles or organic remnants without damaging the surface of the specimen.

A yet further object of the invention is to provide a method and apparatus capable of removing smaller particles from the surface.

A still further object of the invention is to provide a simpler and less expensive method and apparatus for cleaning a substrate surface.

It is another object of the present invention to remove particles or organic remnants without using ionized and accelerated clusters.

These and other objects and advantages are provided by the present invention, as will become more apparent with the following description.

According to one aspect of the present invention, there is provided a dry cleaning method which includes the steps of: forming a neutral cluster; and injecting the neutral cluster at a selected angle with respect to a surface of a specimen which is being cleaned.

The forming step includes the steps of: establishing the specimen in a chamber having a first pressure; supplying a cleaning gas having a second pressure into the chamber through a nozzle shaped as a sand glass of which a diameter decrease along a progress path of the cleaning gas to a first length of the sand glass and increases from the first length to a second length; and adiabatically expanding the cleaning gas injected from the nozzle using a pressure difference between the first pressure of the gas and the second pressure of the chamber.

It is desirable that the first pressure ranges from approximately 5 psig to approximately 140 psig and the second pressure ranges from approximately 200 mTorr to approximately 0.01 mTorr.

According to another aspect of the invention, there is provided a dry cleaning apparatus which comprises: a chamber in which a specimen having a surface which is being cleaned is established; and a nozzle established within the chamber, for injecting a neutral cluster at a selected angle with the respect to the surface of the specimen. The chamber includes: a chuck for holding the specimen; and means for reciprocating and rotating the chuck.

It is desirable that the nozzle is shaped as an hour glass of which the diameter decreases along a progress path of the cleaning gas to a first length of the hour glass and increases from the first length to a second length.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Hereinbelow, preferred embodiments of the present invention are described with reference to the accompanying drawings.

Figure 1:
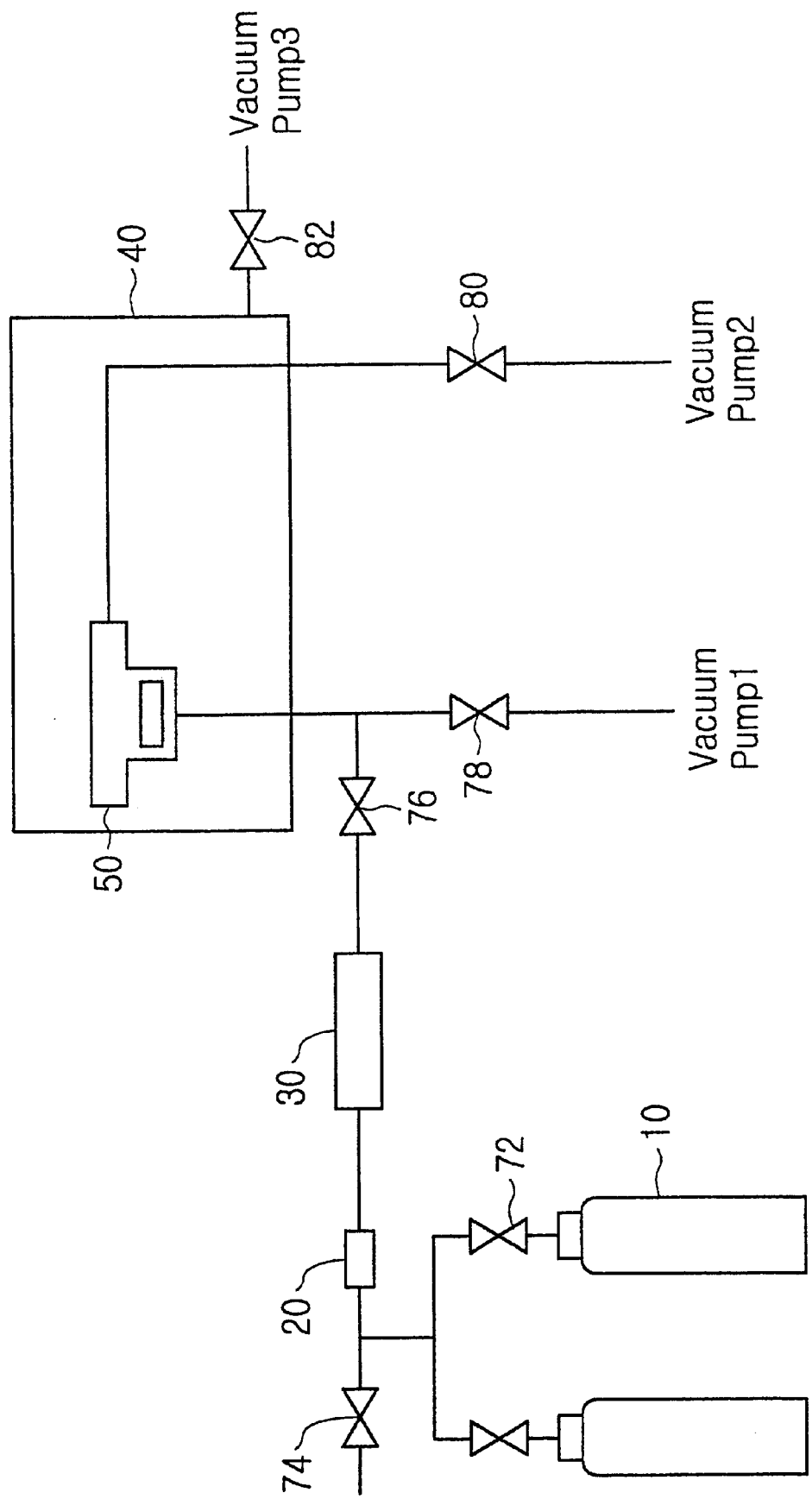
FIG. 1 is a simplified schematic view of a cleaning system including a cleaning apparatus in accordance with the present invention.
Figure 2:
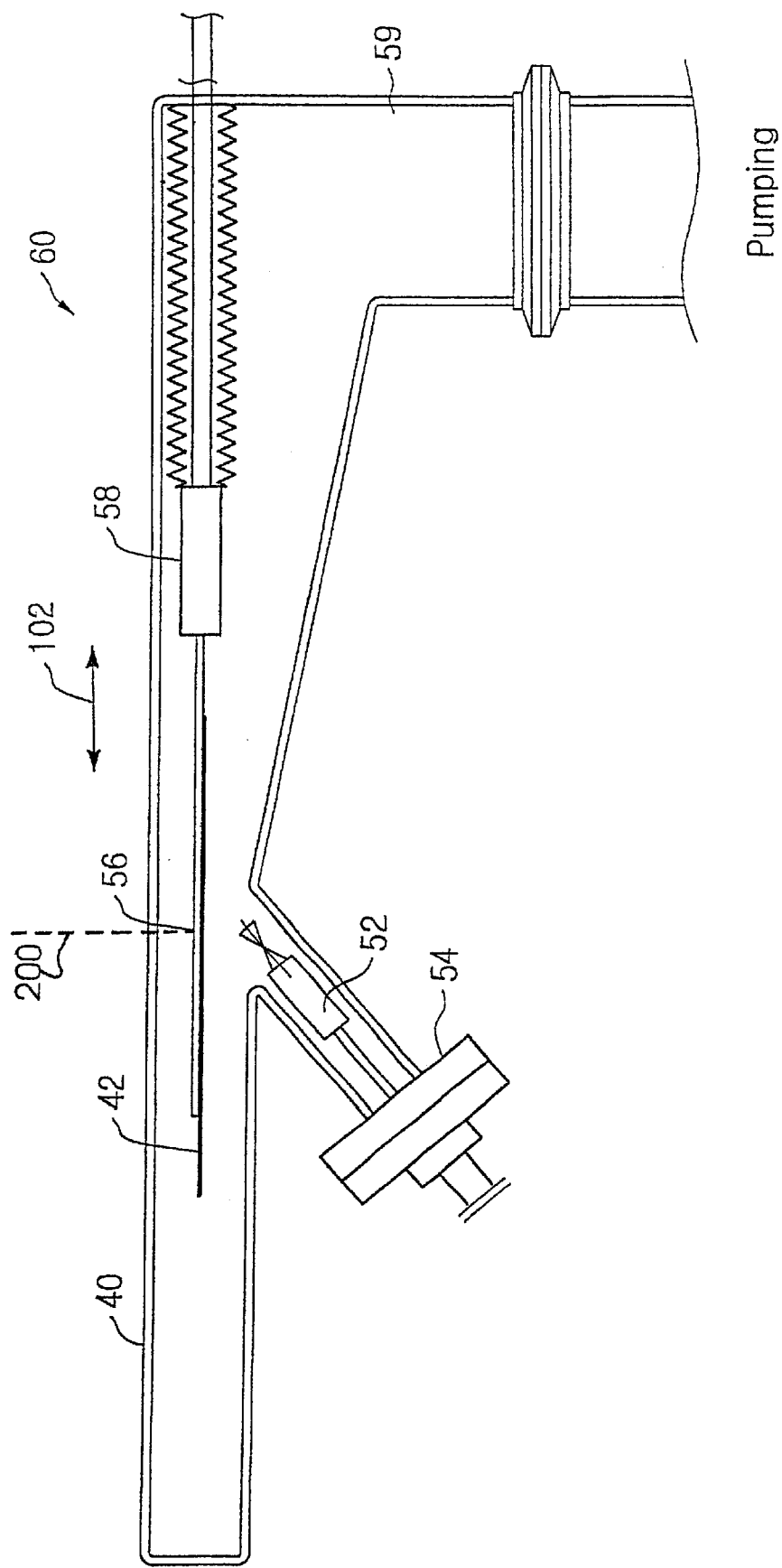
FIG. 2 is a sectional view of the cleaning apparatus of FIG. 1.

FIG. 1 is a simplified schematic view of a cleaning system including a cleaning apparatus in accordance with the present invention and FIG. 2 is a sectional view of the cleaning apparatus of FIG. 1.

Referring to FIGS. 1 and 2, a cleaning apparatus 60 includes a chamber 40 in which a specimen which is being cleaned is established and a cluster injecting unit 50 for transforming a cleaning gas which is supplied for the cleaning into cluster and then injecting the transformed cluster.

In FIG. 1, reference numeral 10 is a gas container for storing cleaning gases, reference numeral 20 is a purifier for filtering impurities from the supplied cleaning gases which are supplied through a gas supply conduit from the cleaning gas container 10, reference numeral 30 is a mass flow controller for controlling the gas flow rate, and reference numerals 72, 74, 76, 78, 80 and 82 are all valves.

Figure 5:
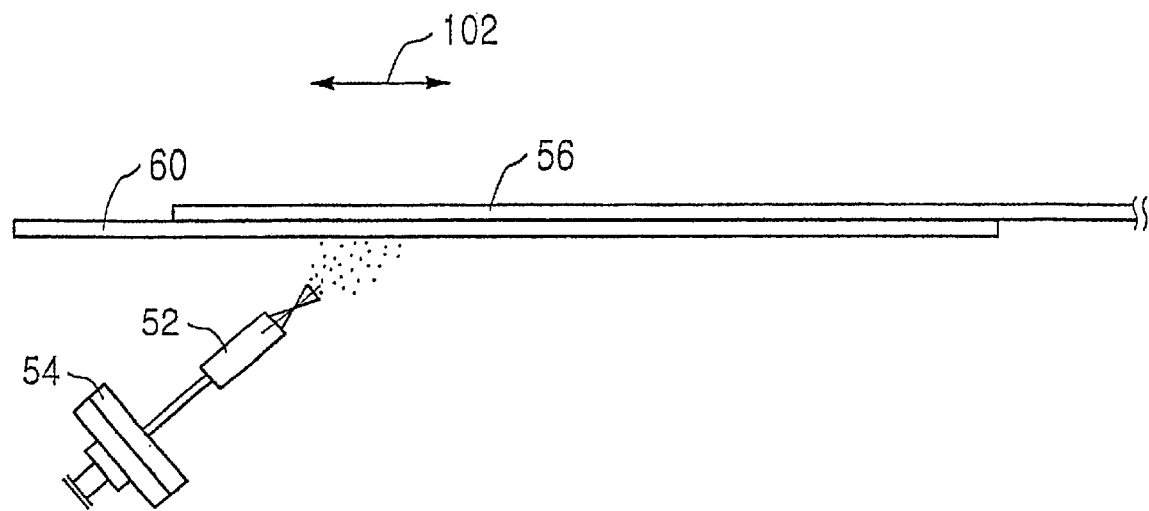
FIG. 5 is an elevational view showing the position of the nozzle of FIG. 2.
Figure 6:
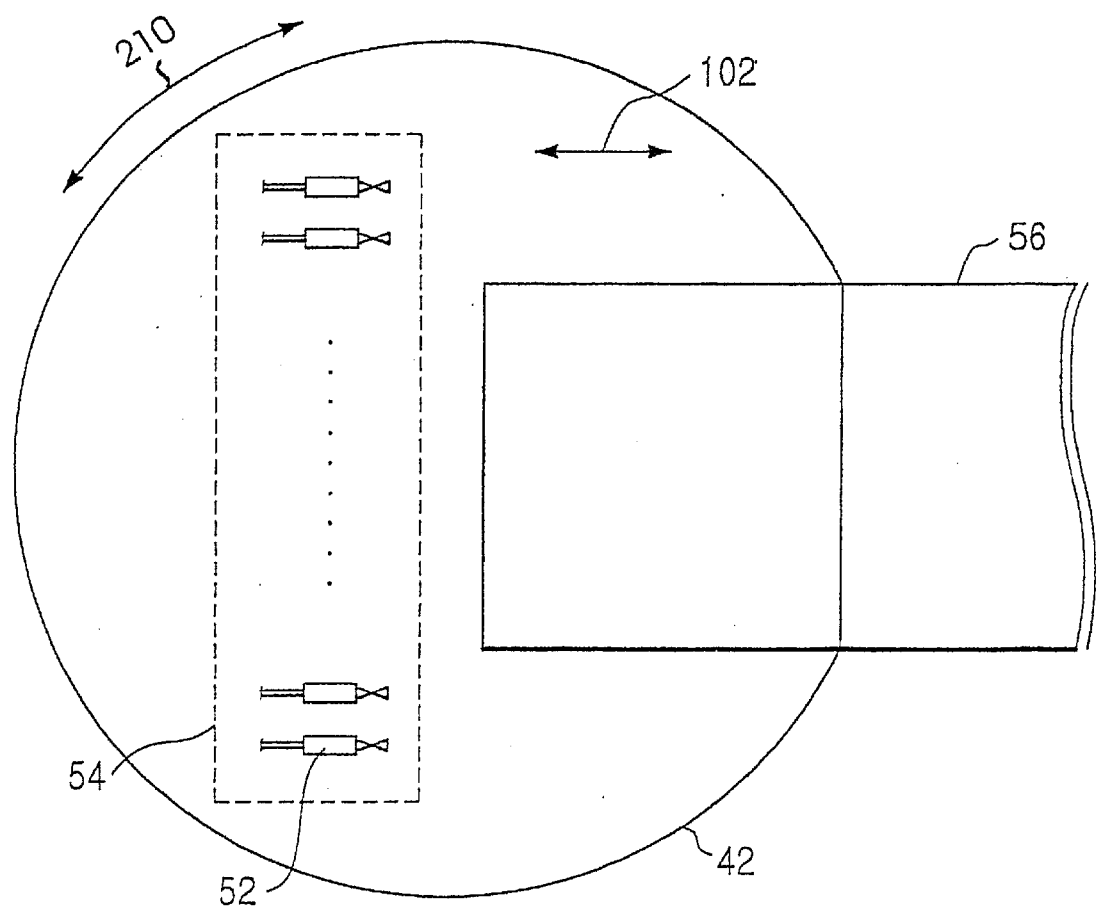
FIG. 6 is a simplified plan view of the portion of the apparatus shown in FIG. 5.

As shown in FIG. 2, a chuck 56 for fixing a specimen is equipped in the chamber 40 such that a surface of the specimen which is being cleaned is directed toward the lower portion of the chamber 40. The chuck 56 is coupled to a chuck reciprocating and rotating motion unit 58 for reciprocating and rotating the chuck 56. Here, the rotation of the chuck rotates the specimen around axis 200 as shown in FIG. 2, that is, in the plane of the specimen as indicate by arrow 210 in FIG.6. The reciprocation direction 102 is indicated in FIGS. 2, 5 and 6.

A cluster injecting unit 50 is also equipped in the chamber 40, and includes a nozzle assembly 52 having a plurality of nozzles 53 and a flange 54 to which the nozzle assembly 52 is coupled and which supplies cleaning gases into respective nozzles 53.

An extraction/pressure control port 59 is equipped in a selected place of the chamber 40. The extraction/pressure control port 59 extracts organic remnants or foreign particles which are removed from the specimen 42 and simultaneously controls the inside pressure of the chamber 40.

Figure 3:
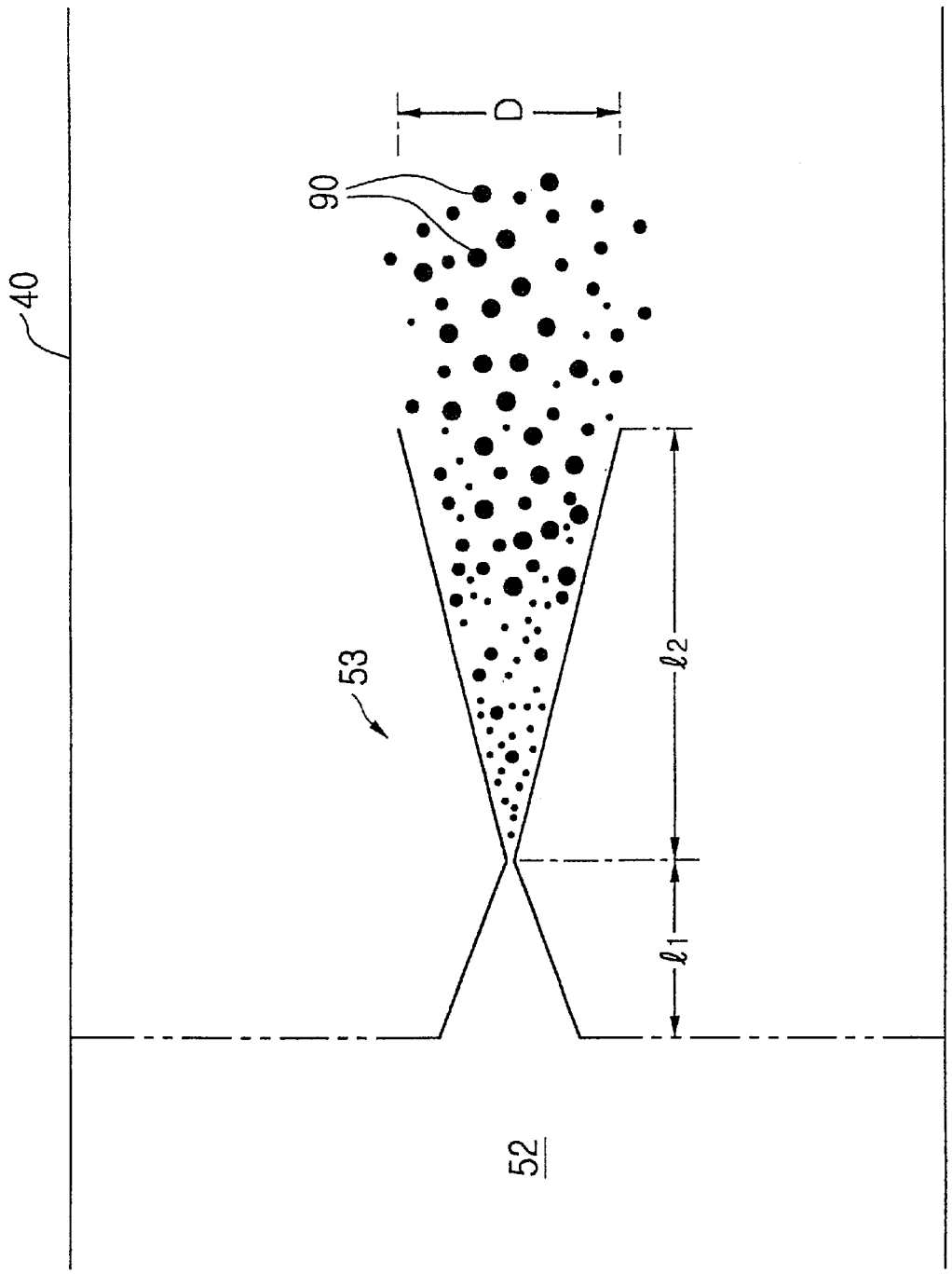
FIG. 3 is a schematic cross-sectional view of the nozzle of the present invention during operation.

Referring to FIGS. 2 and 3, in order for the nozzle 53 of the nozzle assembly 52 to transform supplied cleaning gas into cluster, the nozzle 53 is shaped as an hour-glass in which inlet diameter decrease along progress path to a first length of l1 and increases from the first length of l1 to a second length of l2. In order to effectively form the clusters, it is desirable that the second length l2 is longer than the first length l1. Further, it is desirable that the diameter D of the outlet of nozzle 53 ranges from approximately 0.05 mm to 0.20 mm. The nozzle 53 is arranged with the output from the nozzle directed at an acute angle with respect to the surface of the specimen 42, that is, toward the surface but not perpendicular to the surface. The acute angle preferably is in the range of approximately 45° to approximately 60°.

Figure 4:
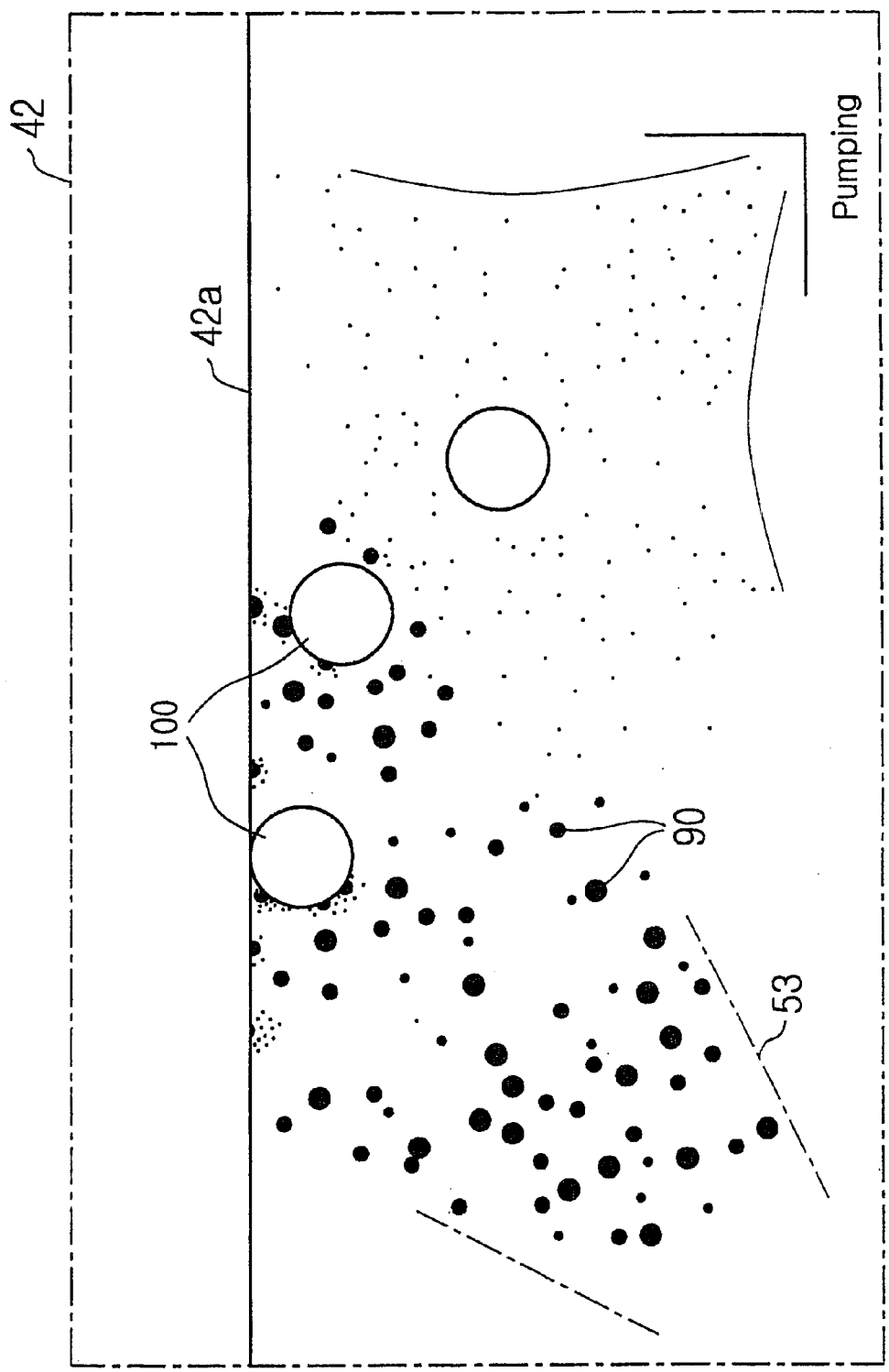
FIG. 4 is a schematic diagram illustrating the formation of neutral clusters.

The present invention uses neutral atomic or molecular clusters as a cleaning source for the surface of the specimen by the above-constituted cleaning apparatus. FIG. 4 is a schematic diagram for describing that the gases supplied from the gas container 10 of FIG. 1 are transformed into the neutral clusters no having polarity.

Referring to FIG. 4, pressurized nitrogen ($N_2$), carbon dioxide ($CO_2$) or argon (Ar) gas is introduced into the nozzle 53 from the gas container 10. The supplied gas is non-cryogenic, that is, the gas has not been cooled to a low temperature before being introduced to the nozzle. As the pressurized gas passes through a boundary region where the nozzle diameter starts to increase after the diameter decreases (that is, the waist of the hourglass) and is injected into the chamber 40 with a low pressure, the pressurized gas expands adiabatically. During the adiabatic expansion, the temperature of the injected gas is abruptly lowered and thereby the gases are clustered.

Thus, the gas molecules are weakly combined together into a lump which is referred to as cluster 90. This cluster 90 represents a different physical state from three conventional states of matter: the gas state, liquid state, and solid state. Cluster 90 may be composed of a few molecules or atoms, or a few ten thousands of clusters may form one aggregation. This aggregation is shaped as sphere and is maintained by van der Waals forces.

This weakly combined cluster 90 collides with the surface 42a of the specimen 42, transfers momentum into particles or organic remnants attached on the surface 42a of the specimen 42, and is then resolved into gas molecules. The particles or organic remnants which receive the momentum from the cluster 90 are separated from the surface 42a of the specimen 42. At this time, particles or organic remnants having different heat expansion coefficient from the surface 42a of the specimen 42 are locally cooled and thereby the separation is accelerated.

The separated particles or organic remnants 100 together with the resolved gas molecules are extracted through the extraction/pressure control port 59 due to gravitation and pressure difference.

The cluster 90 adapted in the present invention is in a neutral, non-ionized state, unlike other previously described systems. Likewise, the clusters 90 of the present invention are different from the aerosol particles of other previously described systems. The aerosol particles are small solid state particles of argon produced by precooling then expanding the gas. By contrast, the gases are not precooled in the present invention, and the resulting clusters are too small to be considered solid particles. The present invention is capable of removing particles smaller than 0.1 $\mu$m much more efficiently than the method using aerosol particles.

In order to control the velocity and the momentum with which the cluster 90 contacts the surface 42a of the specimen 42, the pressure of the inlet and outlet of the nozzle 53 is controlled. This thereby prevent a surface 42a of the specimen 42 which is weak with respect to the applied impact from being damaged.

In order to form the clusters 90, it is desirable that the gas pressure in the inlet of the nozzle 53 be in the range from approximately 5 psig to approximately 140 psig and the pressure of the vacuum chamber 40 be in the range from approximately 200 mTorr to approximately 0.01 mTorr.

In the meanwhile, when the cleaning region where the cleaning effect is created by the collision of the cluster 90 injected from the nozzle 53 is smaller than the whole area of the specimen, the specimen is reciprocated or rotated by the rotational or reciprocating movement of the chuck 56 holding the specimen such that the cleaning effect is created through whole area of the specimen. Thus, since the specimen 42 can rotate or reciprocate with the nozzle assembly 52 fixed at a selected arrangement, it becomes possible to clean the specimen 42 through whole surface area of the specimen 42.

Meanwhile, although the above embodiment shows and describes that the nozzle assembly 52 is fixed and the specimen rotates or reciprocates, it is also possible to perform the converse operation. In other words, by the relative displacement of the nozzle 53 and the specimen 42, the cleaning process can be performed through the whole surface area of the specimen 42.

There has been a trend toward the use of larger wafers in semiconductor processes. If a larger wafer is used, when a single nozzle is used as shown in FIG. 2, the cleaning time may lengthen. So, to shorten the cleaning time, as shown in FIG. 6, a plurality of nozzles 52 are coupled to a single flange 54 along one row and are arranged along at least one column direction, for example, lengthwise direction of the flange 54. The arrangement direction of the column of the nozzles is normal to the movement direction 102 of the reciprocating specimen.

The use of the plurality of nozzles 53 makes it possible to clean an area corresponding to the diameter of the specimen by once spraying. The remaining portion of the specimen 42 is cleaned by the reciprocating movement of the chuck 56 holding the specimen.

The cleaning effect is enhanced as the total collision rate of clusters with the specimen is increased by having multiple nozzles. The specimen can be rotated as many as a few hundred times during the time of one reciprocal motion. Thus, the rotational movement of the specimen makes the effective collision rate greater compared with that of the reciprocating movement, and it is generally more effective to use the rotational movement.

Although the above embodiments show and describe the present invention applied to the cleaning of a semiconductor wafer, it is of course the case that the cleaning method and apparatus can be applied to the cleaning of diamond or other substances.

As described previously, since the cleaning apparatus of the present invention injects the neutral clusters onto the specimen without ionizing the cleaning gas, it is unnecessary to use apparatus of ionizing cleaning gas and of accelerating ionized gas, resulting in simplifying the constitution of the cleaning apparatus. In other words, the invention lowers the fabrication and maintenance cost of the cleaning apparatus.

Further, according to the cleaning method of the present invention, since the cluster is injected in the neutral state from the nozzle without ionizing the gas or electrically accelerating the cluster, particles or organic remnants can be effectively removed without damaging the surface of the specimen. Furthermore, since the present invention does not require cooling the gases, in contrast to the aerosol-based cleaning methods, the cleaning process is simplified.

The present invention is not limited to the above-described embodiments. Various changes and modifications may be effected by one having an ordinary skill in the art and remain within the scope of the invention, as defined by the appended claims.

What is claimed is:

1. A method of cleaning a substrate surface, comprising the steps of:
   adiabatically expanding an atomic or molecular gas through a nozzle to form neutral clusters of the gas atoms or molecules; and
   directing said clusters exiting the nozzle to impinge on the substrate surface.

2. The method of claim 1, said clusters being directed to impinge at an acute angle relative to the surface of the substrate.

3. The method of claim 2, said angle being in the range of approximately 45° to 60°.

4. The method of claim 1, said gas comprising nitrogen, carbon dioxide or argon.

5. The method of claim 1, said substrate being a semiconductor substrate.

6. The method of claim 1, further comprising the step of:
   admitting the gas to the inlet of the nozzle at a pressure in the range of approximately 5 psig to 140 psig.

7. The method of claim 6, further comprising the step of:
   maintaining said substrate surface at a pressure of approximately 200 mTorr to 0.01 mTorr.

8. The method of claim 7, further comprising the step of:
   controlling the admitting pressure of the gas and the maintained pressure of the substrate, for controlling the velocity at which the clusters impinge on the substrate.

9. The method of claim 1, said nozzle having an hourglass shape.

10. The method of claim 9, said nozzle having an outlet diameter in the range of approximately 0.05 mm to 0.20 mm.

11. The method of claim 9, the length of the outlet portion of the hourglass shape being greater than the length of the inlet portion of the hourglass shape.

12. The method of claim 1, further comprising the step of:
   rotating the substrate around an axis perpendicular to the plane of the substrate while the clusters impinge on the surface.

13. The method of claim 12, further comprising the step of:
   reciprocating the substrate in a direction parallel to the plane of the substrate while rotating the substrate.

14. The method of claim 1, further comprising the step of:
   using a plurality of sad nozzles to impinge clusters on the substrate surface.

15. The method of claim 1, said gas being non-cryogenic before being adiabatically expanded.

16. The method of claim 1, further comprising the step of orienting the substrate surface facing downward during the cleaning.

17. An apparatus for cleaning a substrate surface, comprising:
   a chamber for enclosing the substrate;
   mounting means in said chamber, for holding the substrate;
   a non-cryogenic supply of a gas;
   a first nozzle installed in said chamber for adiabatically expanding said gas to form atomic or molecular clusters, said nozzle comprising:
      an inlet connected to the non-cryogenic supply of gas; and
      an outlet directed toward said substrate surface.

18. The apparatus of claim 17, said mounting means being arranged to hold said substrate with the surface of the substrate facing downward, for allowing gravity to help remove particles loosened from the surface.

19. The apparatus of claim 17, said first nozzle being oriented at an acute angle to the surface of the substrate.

20. The apparatus of claim 19, said acute angle being in the range of approximately 45° to 60°.

21. The apparatus of claim 17, said first nozzle having an hourglass shape.

22. The apparatus of claim 21, the length of the outlet portion of the hourglass shape being greater than the length of the inlet portion of the hourglass shape.

23. The apparatus of claim 17, said first nozzle having an outlet diameter in the range of approximately 0.05 mm to 0.20 mm.

24. The apparatus of claim 21, said first nozzle having an outlet diameter in the range of approximately 0.1 mm to 0.2 mm.

25. The apparatus of claim 17, said mounting means further comprising:
   a chuck for rotating the substrate along an axis perpendicular to the plane of substrate surface.

26. The apparatus of claim 25, said mounting means further comprising:
   a chuck reciprocating and rotating unit, for rotating the chuck along the axis perpendicular to the plane of the surface, and for reciprocating the chuck in a direction parallel to the plane of the substrate surface.

27. The apparatus of claim 26, further comprising:
   a plurality of additional nozzles, each having the structure of said first nozzle, for simultaneously cleaning different portions of the substrate surface; and
   a flange for holding said first and additional nozzles.

28. The apparatus of claim 27, further comprising:
   the orientation directions of said first and additional nozzles being parallel to each other; and said first and additional nozzles being arranged on said flange in a row perpendicular to the reciprocating direction of the chuck.

29. The apparatus of claim 17, further comprising:

an extraction/pressure control port, for controlling the inside pressure of the chamber and extracting organic remnants from the atmosphere in the chamber.

30. The apparatus of claim 29, further comprising:

said extraction/pressure control port having means for maintaining the chamber pressure in the range of approximately 200 mTorr to 0.01 mTorr.

31. The apparatus of claim 17, further comprising a purifier located between the gas supply and said inlet of the nozzle.

32. The apparatus of claim 31, further comprising:

a mass flow controller, for controlling the flow of gas to the inlet of the nozzle, said mass flow controller having means for controlling the inlet pressure of the nozzle in the range of approximately 5 psig to 140 psig.

33. The apparatus of claim 17, said gas supply comprising a tank of argon, nitrogen or carbon dioxide.

* * * * *